United States Patent
Zhang

(10) Patent No.: US 10,014,885 B2
(45) Date of Patent: Jul. 3, 2018

(54) METHOD AND APPARATUS FOR COOLING A TELECOMMUNICATION DEVICE

(75) Inventor: Yang Zhang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 340 days.

(21) Appl. No.: 14/388,461

(22) PCT Filed: May 3, 2012

(86) PCT No.: PCT/CN2012/075031
§ 371 (c)(1),
(2), (4) Date: Sep. 26, 2014

(87) PCT Pub. No.: WO2013/163805
PCT Pub. Date: Nov. 7, 2013

(65) Prior Publication Data
US 2015/0047823 A1    Feb. 19, 2015

(51) Int. Cl.
*G05D 23/00* (2006.01)
*H04B 1/036* (2006.01)
(Continued)

(52) U.S. Cl.
CPC .......... *H04B 1/036* (2013.01); *F28F 27/00* (2013.01); *H05K 7/207* (2013.01);
(Continued)

(58) Field of Classification Search
CPC ..... H04B 1/036; F28F 27/00; H05K 7/20209; H05K 7/207; H05K 7/20127; H05K 7/20136
(Continued)

(56) References Cited

U.S. PATENT DOCUMENTS

| 3,977,206 A | * | 8/1976 | Simmons | ................ F28D 15/06 |
| | | | | 165/44 |
| 4,137,964 A | * | 2/1979 | Buckley | ................ F24F 5/0046 |
| | | | | 126/638 |

(Continued)

FOREIGN PATENT DOCUMENTS

| CN | 1203014 | 12/1998 |
| TW | 200614906 | 5/2006 |

(Continued)

OTHER PUBLICATIONS

Supplementary European Search Report for Application No. EP 12 87 5876—dated Aug. 1, 2016.

(Continued)

*Primary Examiner* — Ljiljana Ciric
(74) *Attorney, Agent, or Firm* — Baker Botts, LLP

(57) ABSTRACT

An apparatus for cooling a telecommunication device includes a controller, a first cooling unit, a second cooling unit, and at least one sensor. The first cooling unit includes a heat sink that dissipates heat from the telecommunication device. The second cooling unit includes an airflow generator that, when activated, provides an airflow that dissipates heat from the telecommunication device. The at least one sensor is operably connected with the telecommunication device. The controller is configured to compare a temperature detected by the at least one sensor to a first threshold temperature specified such that a load of the telecommunication device shall be reduced when the temperature detected by the at least one sensor exceeds the first threshold temperature. The controller is configured to activate or increase the airflow provided by the second cooling unit if the temperature detected by the at least one sensor exceeds the first threshold temperature.

10 Claims, 4 Drawing Sheets

(51) Int. Cl.
H05K 7/20 (2006.01)
F28F 27/00 (2006.01)

(52) U.S. Cl.
CPC ..... *H05K 7/20209* (2013.01); *H05K 7/20127* (2013.01); *H05K 7/20136* (2013.01)

(58) Field of Classification Search
USPC ........................................................ 165/287
See application file for complete search history.

(56) References Cited

U.S. PATENT DOCUMENTS

| | | | | |
|---|---|---|---|---|
| 4,224,771 | A * | 9/1980 | Dunsmore | E04B 1/7612 454/191 |
| 4,397,121 | A * | 8/1983 | Dunsmore | E04B 1/7612 454/191 |
| 4,807,441 | A | 2/1989 | Agee et al. | |
| 5,612,677 | A * | 3/1997 | Baudry | G08B 21/187 257/E23.08 |
| 5,676,199 | A * | 10/1997 | Lee | H01L 23/34 165/299 |
| 5,764,506 | A * | 6/1998 | Eynaud | G06F 1/206 236/DIG. 8 |
| 5,765,743 | A * | 6/1998 | Sakiura | F24F 11/053 165/80.3 |
| 5,982,618 | A * | 11/1999 | Roos | H05K 7/20136 361/695 |
| 6,104,003 | A * | 8/2000 | Jones | F26B 21/06 165/104.33 |
| 6,427,466 | B1 * | 8/2002 | Livni | H05K 7/20154 361/162 |
| 6,487,463 | B1 * | 11/2002 | Stepp, III | G05D 23/1934 700/299 |
| 6,504,392 | B2 * | 1/2003 | Fredeman | G01R 1/0458 324/750.05 |
| 6,798,659 | B2 * | 9/2004 | Chen | H01L 23/38 165/121 |
| 7,508,671 | B2 * | 3/2009 | Sauciuc | G06F 1/20 165/104.33 |
| 2003/0063437 | A1 | 4/2003 | Kurihara | |
| 2004/0095721 | A1 * | 5/2004 | Ellsworth, Jr. | H01L 23/467 361/694 |
| 2005/0056036 | A1 * | 3/2005 | O'Baid | F25D 19/006 62/259.2 |
| 2005/0115703 | A1 * | 6/2005 | Lee | F28F 27/00 165/201 |
| 2006/0092607 | A1 | 5/2006 | Chien et al. | |
| 2007/0212598 | A1 * | 9/2007 | Iida | H01M 10/48 429/62 |
| 2007/0235180 | A1 * | 10/2007 | Ouyang | H01L 23/473 165/287 |
| 2008/0316038 | A1 * | 12/2008 | Palaszewski | H05K 7/20181 340/584 |
| 2011/0245976 | A1 | 10/2011 | Thompson et al. | |
| 2012/0070180 | A1 * | 3/2012 | Iijima | G03G 21/206 399/92 |
| 2013/0105117 | A1 * | 5/2013 | Chludzinski | F28D 15/00 165/81 |
| 2013/0141867 | A1 * | 6/2013 | Zhou | H05K 7/20909 361/691 |
| 2013/0233532 | A1 * | 9/2013 | Imwalle | F28F 27/02 165/287 |
| 2013/0242542 | A1 * | 9/2013 | Uchimi | H05K 7/20136 362/97.1 |
| 2015/0153074 | A1 * | 6/2015 | Antel, Jr. | F24J 3/08 165/11.1 |
| 2015/0156919 | A1 * | 6/2015 | Schroedl | H05K 7/20127 361/692 |
| 2016/0091938 | A1 * | 3/2016 | Edwards | G06F 1/3231 700/300 |
| 2016/0270256 | A1 * | 9/2016 | Abe | H05K 7/20209 |
| 2016/0302327 | A1 * | 10/2016 | Dangy-Caye | H05K 7/20127 |

FOREIGN PATENT DOCUMENTS

| | | |
|---|---|---|
| TW | M291201 | 5/2006 |
| TW | 200714186 | 4/2007 |

OTHER PUBLICATIONS

2nd Office Action issued by the State Intellectual Property Office, P.R. China for Patent Application No. 201280072917.1—dated Sep. 2, 2016.

First Office Action issued by the State Intellectual Property Office, P.R. China for Patent Application No. 201280072917.1 (English translation included)—dated Dec. 23, 2015.

PCT International Search Report for International application No. PCT/CN2012/075031, dated Feb. 7, 2013.

Decision on Rejection issued by the State Intellectual Property Office, P.R. China for Patent Application No. 201280072917.1—dated Feb. 15, 2017.

Office Action issued by the Intellectual Property Office of Taiwan for ROC Patent Application No. 102106576—dated Apr. 24, 2017.

Notice of Reexamination, Application No. 201280072917.1; dated Dec. 11, 2017 8 pages with English translation 3 pages.

* cited by examiner

METHOD AND APPARATUS FOR COOLING A TELECOMMUNICATION DEVICE

PRIORITY

This nonprovisional application is a U.S. National Stage Filing under 35 U.S.C. § 371 of International Patent Application Serial No. PCT/CN2012/075031, filed May 3, 2012 and entitled "Method and Apparatus for Cooling a Telecommunication Device."

TECHNICAL FIELD

The present invention generally relates to thermal management of electronic devices and systems. More specifically, the present invention relates to heat dissipation in a telecommunication device.

BACKGROUND

Heat generated by electronic devices and circuitry must be dissipated to improve reliability and prevent premature failure. Remote Radio Unit (RRU), Digital Unit (DU) and microwave communication device are examples of telecommunication equipment that need heat dissipation to reduce their temperature. As one important member in Radio Base Station (RBS) product family, RRU is widely deployed. However, RRU with high coverage generates large amount heat, which will decrease its reliability due to high temperature.

Techniques for heat dissipation include natural cooling and forced cooling. Natural cooling needs no extra devices or energy input. It is featured with low airflow rate, bulky heat sinks, energy saving and noise-free environment. Typically, a heat sink consists of a metal plate with one or more flat surfaces to ensure good thermal contact with the components to be cooled, and an array of comb or fin like protrusions to increase the surface contacting with the air. The high thermal conductivity of the metal combined with its large surface area result in the rapid transfer of thermal energy to the surrounding.

RRU is usually installed near antenna, and thus for easy installation, it shall be designed to be as compact and light as possible. However, heat sinks impose a severe restriction on RRU in terms of volume and weight, and in this sense, natural cooling is unsatisfied.

A heat sink is sometimes used in conjunction with a fan to increase the rate of airflow over the heat sink and a larger temperature gradient is maintained by replacing warmed air faster than convection would. As a result, a compact heat sink is available. This is known as forced cooling approach. However, it is featured with high energy consumption and high acoustic noise level. For some base stations with forced cooling mechanism, their sound power levels can reach at 79 dBA, which is harmful to health. Often, RRUs are necessarily installed near residential areas where their noise level shall be strictly controlled. In such a case, these RRUs have to be equipped with bulky heat sinks. As for the forced cooling, another issue involves in fan failure, which is a fatal menace for RRUs.

SUMMARY OF THE INVENTION

In light of the above, one of the objects of the present invention is to provide a solution which can gratify at least one of the problems as described above.

According to one aspect of the present invention, a method for cooling a telecommunication device, wherein cooling is provided by natural cooling and forced cooling which is adjustable, the method comprising:
  estimating a thermal state of the telecommunication device; and
  if the cooling capacity mismatches the thermal state, making an adjustment to the forced cooling rate.

In the above-mentioned method, natural cooling function and forced cooling function can be effected either concurrently or separately based on the thermal state. This makes it possible to tailor heat sinks and air flow generators to various applications.

In a preferred embodiment according to the present invention, wherein the thermal state is represented by temperature measured inside or outside the telecommunication device, and the cooling capability is deemed to mismatch the thermal state if the temperature exceeds a first threshold above which the telecommunication device is not permitted to operate or shall reduce its load.

In a preferred embodiment according to the present invention, wherein the thermal state is represented by temperature measured inside or outside the telecommunication device, and the cooling capacity is deemed to mismatch the thermal state if the temperature is below a second threshold and forced cooling is in operation, the second threshold is not greater than the first threshold.

According to another aspect of the present invention, an apparatus for cooling a telecommunication device, wherein cooling is provided by natural cooling and forced cooling which is adjustable, the apparatus comprising:
  at least one sensor configured to detect a thermal state of the telecommunication device;
  a natural cooling unit adapted to be integrated with or mounted on the telecommunication device and to provide natural cooling;
  a forced cooling unit adapted to be mounted on the telecommunication device and to provide forced cooling; and
  a controller communicatively coupled to the at least one sensor and the forced cooling unit, and configured to adjust the forced cooling rate if the cooling capacity mismatches the thermal state.

In a preferred embodiment according to the present invention, wherein the natural cooling unit comprises a heat sink having a plurality of fins being arranged in parallel on a surface of thereof, and the forced cooling unit comprises at least one air flow generator for generating air flowing along a surface of the heat sink.

In a preferred embodiment according to the present invention, wherein the forced cooling unit is further configured to provide forced cooling with different levels and the controller is further configured to activate the forced cooling unit to operate at the different levels based on the thermal state.

According to another aspect of the present invention, a telecommunication device comprising:
  a unit for performing telecommunication function; and
  an apparatus mounted or integrated with the unit, wherein the apparatus provides the telecommunication device with natural cooling and forced cooling.

BRIEF DESCRIPTION OF THE DRAWINGS

The foregoing and other objects, features, and advantages of the present invention will be apparent from the following more particular description of preferred embodiments as illustrated in the accompanying drawings in which.

DETAILED DESCRIPTION

Figure 1:
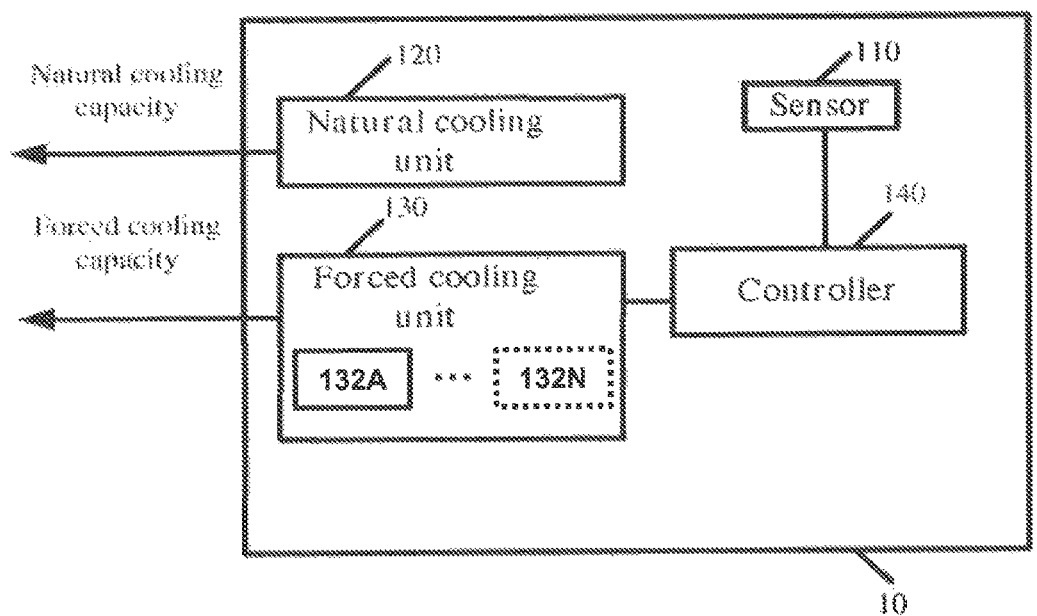
FIG. 1 is a block diagram illustrating one exemplary embodiment of an apparatus for cooling a telecommunication device according to the present invention.

While the invention covers various modifications and alternative constructions, embodiments of the invention are shown in the drawings and will hereinafter be described in detail. However, it should be understood that the specific description and drawings are not intended to limit the invention to the specific forms disclosed. On the contrary, it is intended that the scope of the claimed invention includes all modifications and alternative constructions thereof falling within the scope of the invention as expressed in the appended claims.

Unless defined in the context of the present description, otherwise, all technical and scientific terms used herein have the same meaning as commonly understood by one of ordinary skill in the art to which this invention belongs.

For illustrative purpose, the following embodiments are described in the context of RRU. However, one skilled artisan in the art would recognize that the present invention is applicable to any telecommunication devices, such as Digital Unit (DU) and microwave communication device.

FIG. 1 is a block diagram illustrating one exemplary embodiment of an apparatus for cooling a telecommunication device according to the present invention.

With reference to FIG. 1, the apparatus 10 according to this embodiment comprises a sensor 110, a natural cooling unit 120, a forced cooling unit 130, and a controller 140 which communicatively coupled to the sensor 110 and the forced cooling unit 130. Forced cooling unit 130 comprises at least one air flow generator, such as air flow generator 132A shown in FIG. 1. In some embodiments, forced cooling unit 130 comprises a plurality of air flow generators, such as air flow generators 132A-132N shown in FIG. 1.

In the present embodiment, the heat generated in the telecommunication device is dissipated by the natural cooling unit 120 individually or both of the natural cooling unit 120 and the forced cooling unit 130, depending on what thermal state the telecommunication device is in. No matter what the thermal state is like, the natural cooling unit 120 functions well. This means that in the event of failure of the forced cooling unit 130, basic cooling is always ensured and thus prevents the telecommunication device from undergoing fatal consequence. While the telecommunication device is in a high thermal state, i.e., above a critical level, the basic cooling is insufficient to dissipate the heat, and hence the controller 140 will activate the forced cooling unit 130 to provide additional cooling.

On the other hand, if the telecommunication device is in a low thermal state far below the critical level and the forced cooling unit 130 is in operation, it is preferable to deactivate or decrease the forced cooling rate to reduce power consumption, decrease noise level and extend its life expectancy.

Preferably, a critical level is associated with one point, above which the telecommunication device is not permitted to operate or shall reduce its load, otherwise its life time will be significantly shortened. In the present embodiment, the thermal state is characterized by a temperature measured or obtained inside and/or outside the telecommunication device. This temperature is measured or obtained by the sensor 110 and then is compared with a critical temperature. Generally, the critical temperature for the high thermal state relies on what application the apparatus is applied to. For example, it can be set as one above which the telecommunication devices are not permitted to operate or shall reduce its load. Moreover, the setting of the critical temperature can aim at activating the forced cooling unit as little as possible while keeping the thermal state within a safe range. The examples of the temperature include but are not limited to a junction temperature inside a semiconductor chip or a temperature at one component pin.

Additionally, the low thermal state can be also characterized by temperature. For example, it is considerable to specify a threshold for the low thermal state, which is equal to or lower than the critical temperature. If the temperature is below the threshold and the forced cooling unit 130 is in operation, the controller 130 deactivates or decreases the forced cooling.

In the present embodiment, the sensor 110 is mounted inside or outside a RRU and is coupled to the controller 140 via wireless or cable connection. The sensor 110 is configured to transmit the measured temperature to the controller 140 periodically or in response to a query from the controller 140.

Alternatively, a set of temperatures measured at different positions can be combined to more accurately represent the thermal state. In such a case, a plurality of sensors are mounted inside and/or outside the RRU and are coupled to the controller 140 via wireless or cable connection.

Figure 3:
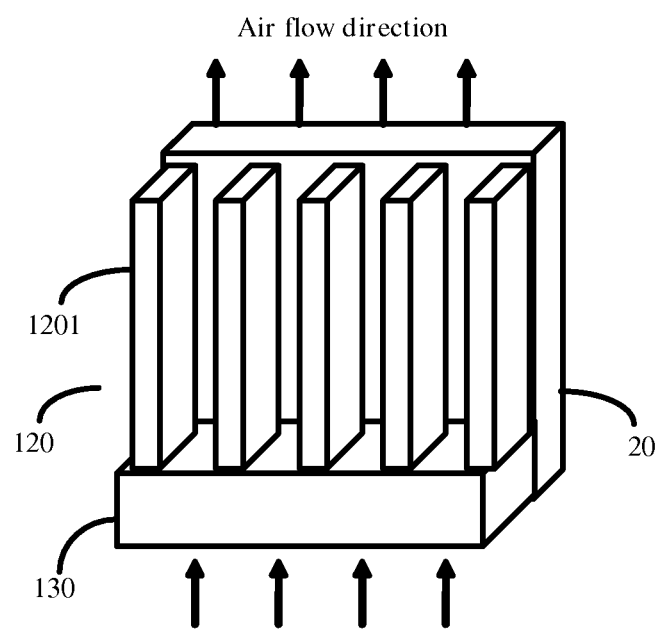
FIG. 3 is a diagram illustrating another example of the combination of natural cooling unit and forced cooling unit used in the apparatus as shown in FIG. 1.

FIG. 3 is a diagram illustrating one example of the combination of natural cooling unit and forced cooling unit used in the apparatus for cooling a telecommunication device as shown in FIG. 1.

Figure 2:
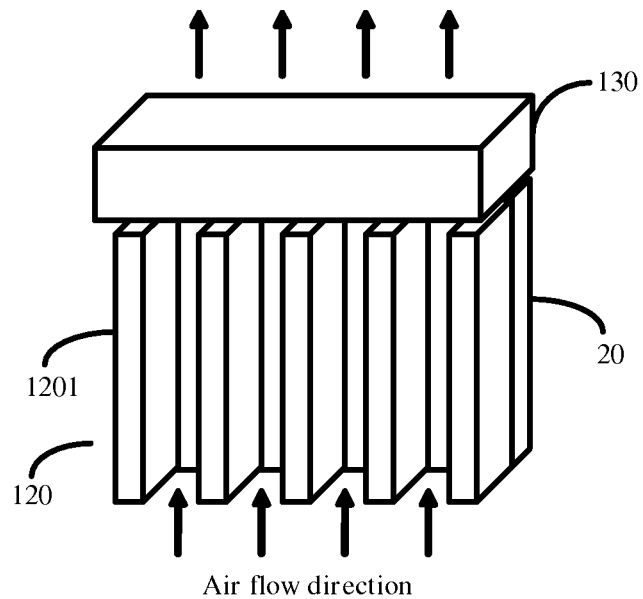
FIG. 2 is a diagram illustrating one example of the combination of natural cooling unit and forced cooling unit used in the apparatus as shown in FIG. 1.

Typically, the natural cooling unit 120 consists of a metal plate and a plurality of fins. Referring to FIG. 2, however, the natural cooling unit 120 in this example is in form of a heat sink only consisting of a plurality of fins 1201 arranged in parallel on the surface of the RRU 20. The absence of the metal plate leads to a more compact structure. However, it shall be noted that the natural cooling unit 120, e.g., the fins 1201 may be integrated with or be parts of the RRU 20. In the present embodiment, the fins 1201 are made of metal such as aluminum, copper and their alloy.

Regardless of the thermal state of the RRU, the natural cooling unit 120 always functions well so as to provide basic cooling. While the thermal state of RRU 20 is above a predetermined level, e.g., the temperature measured by the sensor 110 exceeds a critical temperature, the controller 140 will activate the forced cooling unit 130 or instruct it to increase its output power.

In the present embodiment, as shown in FIG. 2, the forced cooling unit 130 is implemented in form of a fan array which is installed on the top of RRU 20 and acts as one or more air flow generators. Specifically, in operation, sucking force is generated by the fan array to make air flow along the surface of the RRU 20 with the fins 1201, carrying one portion of the heat from the RRU 20. Therefore, besides the basic cooling by the fins 1201, additional cooling is provided.

FIG. 3 is a diagram illustrating another example of the combination of natural cooling unit and forced cooling unit used in the apparatus for cooling a telecommunication device as shown in FIG. 1.

In this example, the natural cooling unit 120 also consists of a plurality of fins arranged in parallel on the surface of the RRU 20 and provides basic cooling. Moreover, while the thermal state of RRU 20 is above a predetermined level, the controller 140 will activate the forced cooling unit 130 or instruct it to increase its output power.

In this example, however, as shown in FIG. 3, the forced cooling unit 130 is implemented in form of a Synthetic Jet actuator array which is installed on the bottom of RRU 20 and is regarded as a set of air flow generators. In operation, the actuator array generates a continual flow of vortices that are formed by alternating brief ejection and suction of air across an opening such that the net mass flux is zero. With the continual flow rapidly passing along the surface of the RRU 20, one portion of the heat from the RRU 20 is carried away and thus additional cooling is provided. Various examples of Synthetic Jet actuator are known to the art, including one disclosed in U.S. application Ser. No. 12/288,144 (John Stanley Booth et al.), entitled "Light Flexture With Multiple LEDs And Synthetic Jet Thermal Management System", which is incorporated herein by reference.

In the examples as shown in FIGS. 2 and 3, the forced cooling unit 130 comprises a plurality of air flow generators (such as air flow generators 132A-132N illustrated in FIG. 1). Therefore, by turning on or turning off some of the air flow generators, the forced cooling unit 130 can provide additional cooling with multiple-level. Moreover, one or more among the air flow generators may be reserved for backup so as to improve the reliability. However, the above multiple-level scheme can be performed by the forced cooling unit 130 having one air flow generator with a tunable output power.

In the present embodiment, the fins 1201 are designed to have a tradeoff between the natural cooling and the forced cooling. For example, the optimized geometry of the fins 1201 makes a balance between natural cooling performance and forced cooling performance. As a result, neither the natural cooling performance nor the forced cooling performance reaches its best point, but cooling performance in total is optimal. In another example, the optimization may be directed to make the basic natural cooling as large as possible. A number of factors may be considered in the optimization, including but not limited to the critical temperature, the upper limit of the weight of the natural cooling unit, the restriction on geometry of the natural cooling unit, the minimum basic cooling required, the maximum noise level as permitted, and the like. As for the telecommunication devices, preferably, the fins 1201 are optimized to have a spacing of 5 mm-15 mm and an average thickness of 0.8 mm-3 mm.

Figure 4:
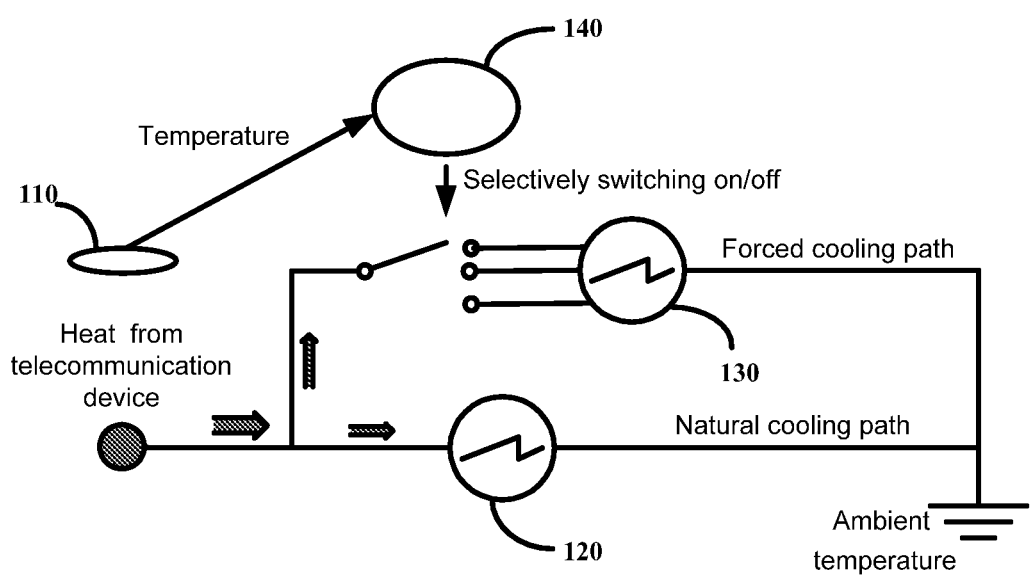
FIG. 4 is a diagram illustrating heat flux flowing in the apparatus as shown in FIG. 1.

FIG. 4 is a diagram illustrating heat flux flowing in the apparatus as shown in FIG. 1.

Referring to FIG. 4, the natural cooling unit 120 and the forced cooling unit 130 provide two paths for heat flux from the RRU 20, i.e., a natural path and a forced cooling path. The sensor 110 transmits the measured temperature to the controller 140, which compares the measurement with the critical temperature. While the RRU 20 operates in a normal thermal state, e.g., the measured temperature is not greater than the critical temperature, the heat flux flows to the surrounding only via the natural cooling path. On the other hand, the forced cooling path is switched on or off by the controller 140. If the controller 140 determines the thermal state is above the critical temperature, it switches on the forced cooling path, and thus a part of the heat flux flow along this path.

As described above, the forced cooling unit 130 may comprise a plurality of air flow generators. Therefore, the forced cooling path may consist of two or more branches connected in parallel between the RRU 20 and the surrounding and each of the branches may contain one or more air flow generators. With such a structure, the controller 140 may selectively switch on or off one or more of the branches so as to provide multiple-level forced cooling.

In the above embodiment, the apparatus 10 is described as an individual entity in relation to a telecommunication device. However, the present invention shall not be limited to such architecture. In fact, the apparatus 10 may be regarded as one part of the telecommunication device.

Figure 5:
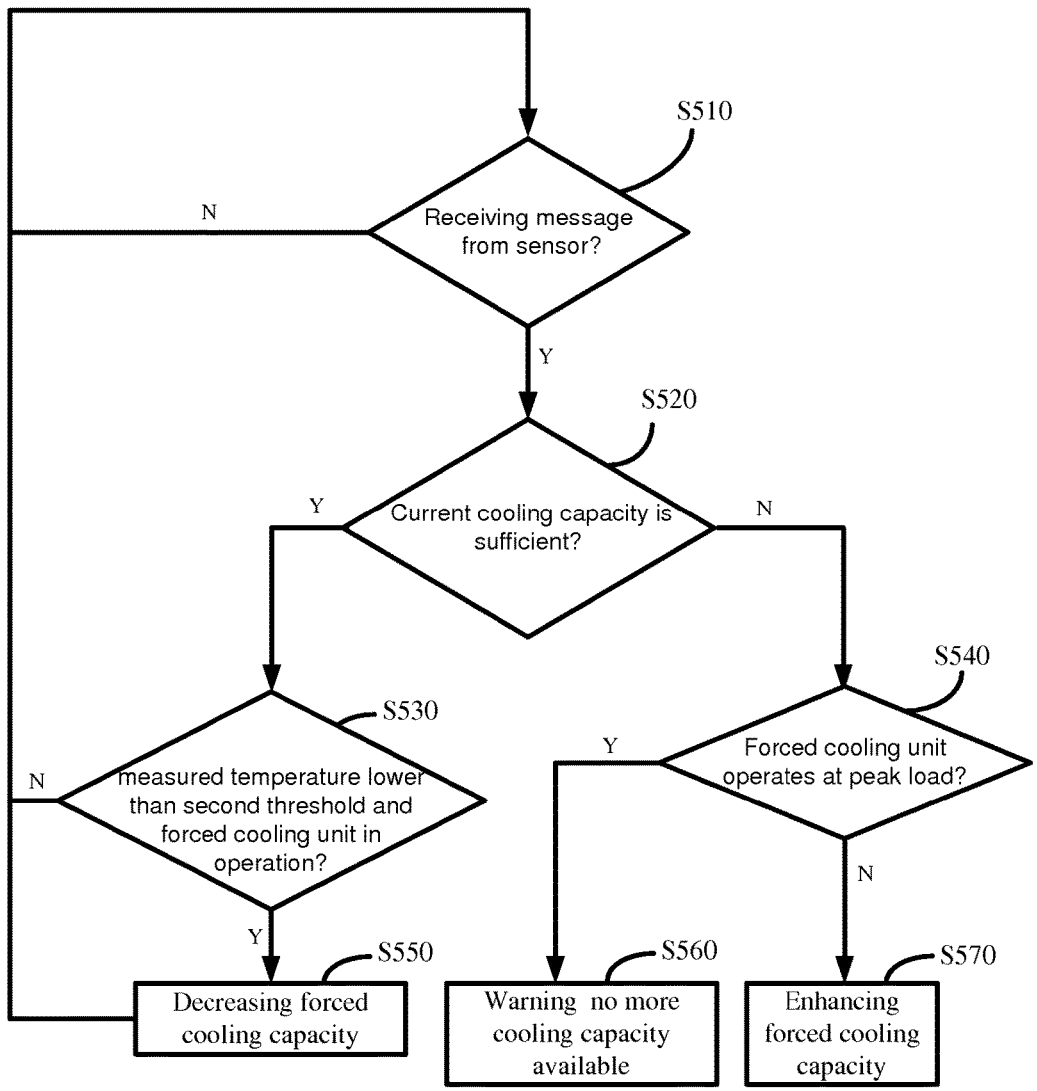
FIG. 5 is a process flow diagram of a method for cooling a telecommunication device according to one exemplary embodiment of the present invention.

FIG. 5 is a process flow diagram of a method for cooling a telecommunication device according to one exemplary embodiment of the present invention. For illustrative purpose, the present embodiment is described in the context of the apparatus as shown in FIGS. 1-4. However, one skilled artisan in the art would recognize that the present embodiment is applicable to any other apparatuses comprising a natural cooling unit and a forced cooling unit.

With reference to FIG. 5, at step S510, the controller 140 determines whether it receives from the sensor 110 a message indicating a thermal state of the RRU 20, e.g., temperature measured inside or outside the RRU 20. The sensor 110 may transmit the message periodically or in response to a query from the controller 140. In the event of the receipt of the message, the process proceeds to step S520, which will be described in detail; otherwise, the controller 140 continues to wait for the message.

Then, at step S520, the controller 140 determines whether the current cooling capability is sufficient to the thermal state of the RRU 20. In the present embodiment, this is accomplished by comparing the measured temperature with a first threshold, i.e. the critical temperature. If the measured temperature is not greater than the first threshold, the process proceeds to step S530 for maintaining or decreasing the current cooling capability; otherwise, the process proceeds to step S540, increasing the current cooling capability or warning the cooling capability cannot match the thermal state.

Referring to FIG. 5, at step S530, the controller 140 further determines whether the measured temperature is lower than a second threshold and the forced cooling unit 130 is in operation. The second threshold is set to be equal to or lower than the first threshold. If it is true, the process proceeds to step S550 for deactivating the forced cooling unit 130 or turning off one or more of the air flow generators and then returns to step S510; otherwise, the process returns to step S510 directly.

For another branch, at step S540, the controller 140 further determines whether the forced cooling unit 130 operates at its peak load. If it is true, the process proceeds to step S560, warning the RRU 20 that no more cooling capability is available; otherwise, the process proceeds to step S570 for activating the forced cooling unit 130 or turning on more air flow generators. After steps S560 and S570, the process returns to step S510.

It should be noted that the aforesaid embodiments are illustrative of this invention instead of restricting this invention, substitute embodiments may be designed by those skilled in the art without departing from the scope of the claims enclosed. The wordings such as "include", "including", "comprise" and "comprising" do not exclude elements or steps which are present but not listed in the description and the claims. It also shall be noted that as used herein and in the appended claims, the singular forms "a", "an", and "the" include plural referents unless the context clearly dictates otherwise. This invention can be achieved by means of hardware including several different elements or by means of a suitably programmed computer. In the unit claims that list several means, several ones among these means can be specifically embodied in the same hardware item. The use of such words as first, second, third does not represent any order, which can be simply explained as names.

What is claimed is:

1. An apparatus for cooling a telecommunication device, the apparatus comprising:
   at least one sensor operably connected with the telecommunication device and configured to detect a temperature inside or at the telecommunications device;
   a first cooling unit comprising a heat sink adapted to dissipate heat from the telecommunication device;
   a second cooling unit comprising an airflow generator adapted to provide airflow to the telecommunication device when the airflow generator is activated; and
   a controller communicatively coupled to the at least one sensor and the second cooling unit, the controller configured to:
      compare the temperature detected by the at least one sensor to a first threshold temperature, wherein the first threshold temperature is specified such that a load of the telecommunication device shall be reduced when the temperature detected by the at least one sensor exceeds the first threshold temperature; and
      activate or increase the airflow provided by the second cooling unit if the temperature detected by the at least one sensor exceeds the first threshold temperature.

2. The apparatus of claim 1, wherein the controller is further configured to determine, during operation of the second cooling unit, whether the temperature is below a second threshold.

3. The apparatus of claim 2, wherein the controller deactivates or decreases the airflow provided by the second cooling unit in response to determining that the temperature is below the second threshold during operation of the second cooling unit.

4. The apparatus according to claim 1, wherein the second cooling unit is further configured to provide different levels of airflow and the controller is further configured to operate the second cooling unit at the different levels of airflow depending on the temperature associated with the telecommunication device.

5. The apparatus of claim 4, wherein the airflow generator comprises a tunable output power that provides the different levels of airflow.

6. The apparatus of claim 4, wherein the second cooling unit comprises a plurality of airflow generators and the different levels of airflow are obtained by turning some of the airflow generators on or off.

7. An apparatus comprising:
   a telecommunication device;
   one or more sensors operably connected with the telecommunication device and configured to detect a temperature inside or at the telecommunications device;
   a first cooling unit comprising a heat sink adapted to dissipate heat from the telecommunication device, wherein the heat sink includes a plurality of fins arranged in parallel on a surface of the telecommunication device;
   a second cooling unit comprising an airflow generator adapted to provide airflow to the telecommunication device when the airflow generator is activated wherein the airflow generator is provided to generate the airflow along the surface of the telecommunication device; and
   a controller operably connected to the one or more sensors and the second cooling unit, the controller configured to:
      compare the temperature detected by the one or more sensors to a first threshold temperature, wherein the first threshold temperature is specified such that a load of the telecommunication device shall be reduced when the temperature detected by the one or more sensors exceeds the first threshold temperature; and
      activate or increase the airflow provided by the second cooling unit if the temperature detected by the one or more sensors exceeds the first threshold temperature.

8. The apparatus of claim 7, wherein
   the fins are spaced at least 5 mm apart and no more than 15 mm apart; and
   each fin has an average thickness of at least 0.8 mm and no more than 3 mm.

9. The apparatus of claim 7, wherein the second cooling unit is installed in a fixed position relative to the heat sink.

10. The apparatus of claim 9, wherein the second cooling unit is installed on the bottom of the telecommunication device and wherein the second cooling unit comprises a synthetic␣␣␣let actuator array of airflow generators that, when activated, alternates between ejection and suction of air.

* * * * *